(12) United States Patent
Greer (10) Patent No.: US 6,750,460 B2
(45) Date of Patent: Jun. 15, 2004

(54) SYSTEM AND METHOD FOR ADJUSTING THE PROPERTIES OF A DEVICE BY GCIB PROCESSING

(75) Inventor: James A. Greer, Andover, MA (US)

(73) Assignee: Epion Corporation, Billerica, MA (US)

( * ) Notice: Subject to any disclaimer, the term of this patent is extended or adjusted under 35 U.S.C. 154(b) by 330 days.

(21) Appl. No.: 09/842,540

(22) Filed: Apr. 26, 2001

(65) Prior Publication Data

US 2002/0005676 A1 Jan. 17, 2002

Related U.S. Application Data (60) Provisional application No. 60/201,200, filed on May 2, 2000.

(51) Int. Cl.[7] .............................................. H01J 37/30
(52) U.S. Cl. ............................ 250/492.2; 250/492.21; 250/492.3
(58) Field of Search ........................ 250/492.2, 492.21, 250/309, 492.3, 398

(56) References Cited

U.S. PATENT DOCUMENTS

| 4,243,960 A | 1/1981 | White et al. | |
| 4,757,283 A | 7/1988 | Greer | |
| 4,933,588 A | 6/1990 | Greer | |
| 5,010,270 A | 4/1991 | Greer | |
| 5,091,051 A | 2/1992 | Greer | |
| 5,211,994 A * | 5/1993 | Tsukazaki et al. | 427/523 |
| 5,238,532 A | 8/1993 | Zarowin et al. | |
| 5,331,172 A * | 7/1994 | Kumar et al. | 250/492.21 |
| 5,459,326 A | 10/1995 | Yamada | |
| 5,814,194 A | 9/1998 | Deguchi et al. | |
| 6,537,606 B2 * | 3/2003 | Allen et al. | 427/9 |

OTHER PUBLICATIONS

J.A. Northby et al., A method and apparatus for surface modification by gas–cluster ion impact, NIM B74 (1993) p. 336.

* cited by examiner

Primary Examiner—Kiet T. Nguyen
(74) Attorney, Agent, or Firm—Perkins Smith & Cohen LLP; Jerry Cohen; Jacob N. Erlich (57) ABSTRACT

A system and method of precisely adjusting the properties of a device using a gas cluster ion beam (GCIB) are described. Use of the invention permits the precise removal or addition of small amounts of material without significantly damaging or degrading the performance of the device. The system is capable of adjusting the properties of a single device or multiple devices and the devices may be processed serially, in small groups, or all at once. The system is also capable of delivering a single dose or a variety of doses depending on the amount of material needed to be removed or added to adjust the properties.

38 Claims, 9 Drawing Sheets

SYSTEM AND METHOD FOR ADJUSTING THE PROPERTIES OF A DEVICE BY GCIB PROCESSING

CROSS REFERENCE TO RELATED APPLICATIONS

This application claims priority of the U.S. Provisional Application Serial No. 60/201,200 filed May 2, 2000 entitled SYSTEM AND TECHNIQUE FOR ADJUSTING THE FREQUENCY OF A SAW DEVICE BY GCIB PROCESSING.

BACKGROUND OF THE INVENTION

This invention relates generally to adjusting the properties of devices such as surface acoustic wave (SAW) devices, and, more particularly to a system and method for adjusting the frequency of SAW devices by processing the surfaces of the devices by gas cluster ion beam (GCIB) irradiation.

SAW devices are used in a variety of applications, such as resonators for frequency generation oscillators, delay lines, pressure transducers, or as filters. Setting the frequency of SAW devices precisely for a specific resonator or filter application can be a difficult task, especially if numerous devices are required to be set to a specific frequency within a tight tolerance ~100 PPM or less.

Generally, a SAW device comprises a pair of transducers, but sometimes more, with each transducer having a set of conductive members which is disposed on or recessed within an upper portion of a surface which supports surface acoustic wave propagation. As SAW devices find new applications, the requirements for precision in the frequency characteristics of the surface acoustic wave device increase. Accordingly, in many applications, it is now desired to have the center frequency of the device within ±1 ppm of the design frequency. Many factors contribute to deviations from the design center frequency of a SAW device including the fabrication techniques presently used to manufacture SAW devices. Typically, with present techniques, the after fabricated SAW device has an actual center frequency within about ±100 ppm of the design frequency. Accordingly, the frequency characteristic of the fabricated devices must be modified either upwards or downwards in frequency to meet the design frequency. Typical SAW devices for commercial cellular telephone applications are made up of a set of interdigitated transducers (IDTs) deposited onto quartz substrates using conventional photolithography processes. The IDTs have been formed from a variety of metals including pure aluminum, copper-doped aluminum, titanium-doped aluminum, tantalum, or other metal or combination of metals. The variation in the photolithography definition from substrate to substrate, as well as from device to device on the same substrate can cause large frequency variations in a batch of SAW devices. Several techniques have been used to trim or adjust the frequency of these devices including reactive ion etching (RIE) to reduce the SAW device frequency and ion beam milling. For very tight tolerance, it is difficult to use RIE, and ion beam milling can cause significant damage to the single crystal quartz substrate leaving the device unusable for its intended application.

More specifically, SAW devices are typically formed on quartz single crystal substrates varying in size from 2 to 5 inches in diameter. A photomask is used to print patterns of multiple devices on each substrate. Several substrates are then put into a deposition system to deposit the IDTs. Typically the deposition will be carried out by electron beam evaporation. Variations in the evaporation process from run to run, or within a single run can yield variations in film thickness from substrate to substrate, or from batch to batch. As a result of the variations in the photomask, photolithography process, deposition process, and other processing variables, the frequencies of the resulting SAW devices can vary significantly, making the devices unusable for the intended application without some method of post-fabrication frequency modifying operation.

Several techniques are commonly employed in the art to change the frequency characteristics of a SAW device. One technique known as air-baking involves exposing the SAW device to air disposed at an elevated temperature for a limited period of time to produce an upshift in the center frequency of the device. The utility of air-baking is relatively limited, however, since air-baking has not proven to be a reproducible technique, and furthermore, the amount of frequency shift obtained during the air-baking process is extremely limited particularly at frequencies below 500 MHz.

A second method involves using etching techniques such as RIE. The reactive ion etching techniques involve sophisticated equipment, in which the SAW device is exposed to fluorine ions produced by an r.f. discharge. The fluorine ions selectively etch the surface wave propagation surface. The result of reactive ion etching is to trim down the center frequency of the SAW device. With reactive ion etching, frequency adjustment as much as −500 ppm may be obtained. Reactive ion etching, however, involves the use of relatively expensive and sophisticated equipment and, furthermore, the technique may involve relatively long etching times for devices in which a large frequency adjustment is necessary. Additionally RIE is extremely difficult to use for very tight tolerances. In addition, modifying the frequency has been performed by ion beam milling to remove metal from interdigitated transducers (IDTs) to increase the frequency. However, this technique can cause significant damage to the single-crystal quartz substrate, leaving the device unusable for its intended purpose.

Another technique known in the art is set forth in U.S. Pat. No. 4,243,960 by White et al. and in papers entitled "Fine Tuning of Narrow-Band SAW Devices using Dielectric Overlays", 1977 Ultrasonic Symposium Proceedings, IEEE, pgs. 659–663 by Helmick et al. and "Observation of Aging and Temperature Effects on Dielectric-Coated SAW Devices ", 1978 *Ultrasonics Symposium Proceedings*, IEEE, pp. 580–585 by Helmick et al. This patent and these papers describe a technique in which a dielectric coating is provided on the surface wave propagation surface and in contact with the electrodes forming the interdigitated transducers, with the amount of frequency shift selected by controlling the thickness of the deposited coating. While the described technique produces frequency variations, these frequency variations come at the expense of a relatively large increase in the insertion loss of the device generally on the order of 1 db to 2 db, as well as, a relatively large increase in the so-called "turnover temperature" of the piezoelectric material which supports the surface acoustic wave propagation.

Some materials that are commonly employed to support surface wave propagation, such as ST-cut and rotated ST-cuts of quartz, exhibit a parabolic surface wave velocity variation as a function of temperature. The maximum of this parabolic variation is referred to as the "turnover temperature". In many applications, the SAW device is designed to operate close to this temperature, particularly when the frequency stability of the SAW device is of critical importance. Large unpredictable variations in the turnover temperature place the device out of specification for such applications, since the cut of the substrate material is specified for its particular temperature dependent characteristic. Accordingly, the large shifts in the turnover temperature described in the above references make this technique impractical for use in many SAW device applications.

One form of SAW device includes a substrate having a surface for acoustic wave propagation at a predetermined surface acoustic wave velocity characteristic. There are a pair of IDTs coupled to the acoustic wave propagation surface. The two interdigitated transducers are on the substrate surface, and are spaced apart by a region of the acoustic wave propagation surface. A prior art method of adjusting the center frequency of such a SAW device is to adjust the surface wave velocity characteristic of the surface wave device by depositing a thin layer of a nonconducting elastic material, such as aluminum oxide or zinc sulfide onto a portion of the region separating the pair of interdigitated transducers to change the surface wave velocity characteristic of the surface wave device. This method is described in U.S. Pat. No. 4,757,283. A drawback of this technique is that the added (deposited) material has a tendency to undesirably change the relationship between surface wave velocity and ambient temperature for the SAW device.

A further technique for adjusting the characteristics of a SAW device involves depositing a pair of localized regions of frequency determining modifying material onto selected portions of a surface wave propagating surface, to provide localized regions on said surface where the odd order transverse mode has energy maxima. These regions change the acoustic properties and hence the velocity characteristics of the surface wave propagating surface in said regions. The frequency of the odd mode transverse wave is changed accordingly and is preferably changed to match that of the fundamental transverse propagating wave. This decreases the insertion loss of the device at the fundamental frequency and eliminates the odd mode transverse wave propagation characteristic within the operating frequency range of the resonator. Further, in the SAW device which includes an acoustically matched piezoelectric transparent cover disposed over the surface wave propagating surface having disposed thereon a trim pad is selectively removed to provide the localized regions and thus the localized alterations in the acoustic properties of the surface acoustic wave device as described in U.S. Pat. No. 4,933,588. While this is an effective and precise technique, it is an undesirably costly process for high volume commercial applications such as SAW devices for use in cellular telephones.

The use of a gas cluster ion beam (GCIB) for etching, cleaning, and smoothing of the surfaces of various materials is known in the art (See for example, U.S. Pat. No. 5,814,194, Deguchi, et al., "Substrate Surface Treatment Method", 1998). Means for creation of and acceleration of such GCIB's are also described in the Deguchi reference. It is also known (U.S. Pat. No. 5,459,326, Yamada, "Method for Surface Treatment with Extra-Low-Speed Ion Beam", 1995) that atoms in a cluster ion are not individually energetic enough (on the order of a few electron volts to a few tens of electron volts) to significantly penetrate a surface to cause the residual sub-surface damage typically associated with the other types of ion beam processing, including ion milling, in which individual ions may have energies on the order of hundreds or thousands of electron volts. Nevertheless, the cluster ions themselves can be made sufficiently energetic (some thousands of electron volts), to effectively etch, smooth or clean surfaces as shown by Yamada & Matsuo (in "Cluster ion beam processing", *Matl. Science in Semiconductor Processing I*, (1998) pp 27–41). It is also known (see Japanese laid open application 08127867 JP A, Akizuki et al., "Formation of thin film by gas cluster ion beam") that GCIB formed from reactive gas source materials such as $CO_2$, $O_2$, $N_2$, and other materials can be used to form thin films by irradiating a substrate with the GCIB to induce a chemical reaction of the GCIB materials with the substrate.

It is therefore an object of this invention to provide a system and method for effectively and precisely adjusting the properties of a device such as the properties of a SAW device including the characteristic frequencies of such a device.

It is a further object of this invention to provide a system and method to precisely adjust the properties of a SAW device so as to either increase or decrease the property value, including the characteristic frequencies of such device.

It is still another object of this invention to provide a system and method for adjusting the properties of a SAW device without significantly damaging or degrading the performance of the device or the IDTs.

SUMMARY OF THE INVENTION

The objects set forth above as well as further and other objects and advantages of the present invention are achieved by the embodiments of the invention described hereinbelow.

This invention comprises a system and method to precisely adjust the properties of devices, such as SAW devices. This includes, but is not limited to adjusting the characteristic frequency(ies) of SAW devices for specific resonator or filter applications. A gas cluster ion beam is generated and used to irradiate the surface of the SAW device, modifying the surface to change the properties, such as the center frequency of the SAW device in a controlled and predictable manner. The GCIB may be formed from an inert gas such as argon for removing small amounts of the surface materials by etching. The GCIB may also be formed from a reactive source gas such as $O_2$ or $N_2$, for example, for reacting with the surface to change its acoustical properties. The gas cluster ion dose is precisely controlled by monitoring the beam current during the exposure to provide a predetermined dose. The cluster ions are produced in a GCIB apparatus, having a selectable source gas, cluster size distribution, adjustable acceleration energy, and controllable dose delivered to the SAW device. A single SAW device or a substrate of multiple devices can have its properties adjusted by the use of this invention.

For a better understanding of the present invention, together with other and further objects thereof, reference is made to the accompanying drawings and detailed description and its scope will be pointed out in the appended claims.

DETAILED DESCRIPTION OF THE PREFERRED EMBODIMENTS

The present invention provides a system and method for adjusting the properties of devices, such as the frequency of a SAW device or devices, by removing very small amounts of material from the device without significantly damaging it. For example, such trimming can be accomplished using argon GCIB irradiation. In another embodiment, the properties are adjusted by modifying the surface of the device by adding very small amounts of material to the device. This can be accomplished by reactive processing using a reactive GCIB.

Figure 1:
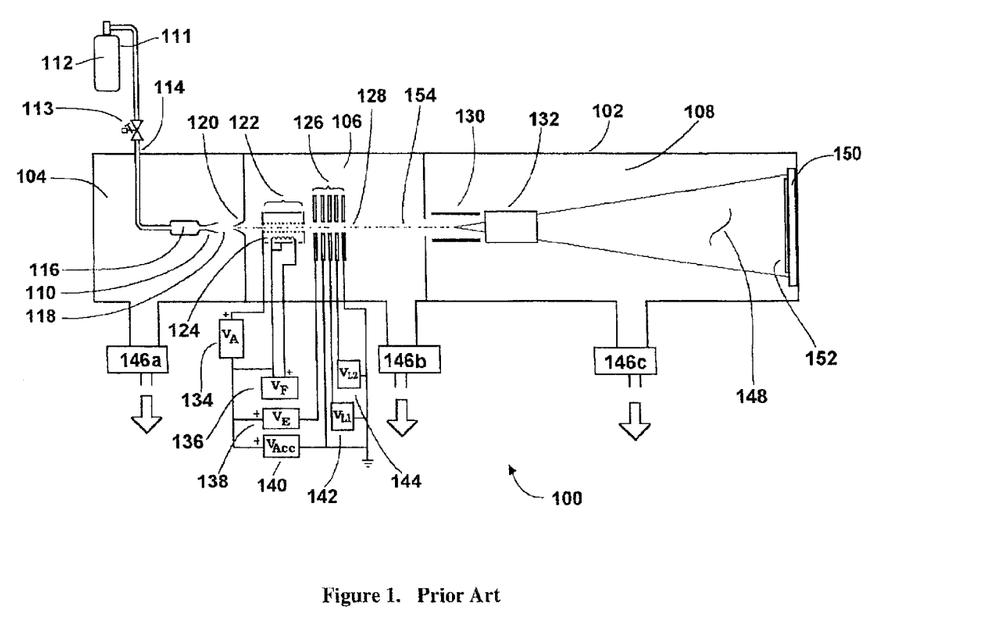
FIG. 1 shows a schematic of a prior art GCIB processing system.

FIG. 1 shows a typical configuration for a GCIB processor 100 of a form known in prior art, and which may be described as follows: a vacuum vessel 102 is divided into three communicating chambers, a source chamber 104, an ionization/acceleration chamber 106 and a processing chamber 108. The three chambers are evacuated to suitable operating pressures by vacuum pumping systems 146a, 146b, and 146c, respectively. A condensable source gas 112 (for example argon or N2) stored in a gas storage cylinder 111 is admitted under pressure through gas metering valve 113 and gas feed tube 114 into stagnation chamber 116 and is ejected into the substantially lower pressure vacuum through a properly shaped nozzle 110. A supersonic gas jet 118 results. Cooling, which results from the expansion in the jet, causes a portion of the gas jet 118 to condense into clusters, each consisting of from several to several thousand weakly bound atoms or molecules. A gas skimmer aperture 120 partially separates the gas molecules that have not condensed into a cluster jet from the cluster jet so as to minimize pressure in the downstream regions where such higher pressures would be detrimental (e.g., ionizer 122, high voltage electrodes 126, and process chamber 108). Suitable condensable source gases 112 include, but are not necessarily limited to argon, nitrogen, carbon dioxide, oxygen, and other gases.

After the supersonic gas jet 118 containing gas clusters has been formed, the clusters are ionized in an ionizer 122. The ionizer 122 is typically an electron impact ionizer that produces thermoelectrons from one or more incandescent filaments 124 and accelerates and directs the electrons causing them to collide with the gas clusters in the gas jet 118, where the jet passes through the ionizer 122. The electron impact ejects electrons from the clusters, causing a portion of the clusters to become positively ionized. A set of suitably biased high voltage electrodes 126 extracts the cluster ions from the ionizer, forming a beam, then accelerates them to a desired energy (typically from 1 keV to several tens of keV) and focuses them to form a GCIB 128 having an initial trajectory 154. Filament power supply 136 provides voltage $V_F$ to heat the ionizer filament 124. Anode power supply 134 provides voltage $V_A$ to accelerate thermoelectrons emitted from filament 124 to cause them to irradiate the cluster containing gas jet 118 to produce ions. Extraction power supply 138 provides voltage $V_E$ to bias a high voltage electrode to extract ions from the ionizing region of ionizer 122 and to form a GCIB 128. Accelerator power supply 140 provides voltage $V_{Acc}$ to bias a high voltage electrode with respect to the ionizer 122 so as to result in a total GCIB acceleration energy equal to $V_{Acc}$ electron volts (eV). One or more lens power supplies (142 and 144 shown for example) may be provided to bias high voltage electrodes with potentials ($V_{L1}$ and $V_{L2}$ for example) to focus the GCIB 128.

A workpiece 152, which may be a SAW device, a semiconductor wafer or other workpiece to be processed by GCIB processing, is held on a workpiece holder 150, disposed in the path of the GCIB 128. Since most applications contemplate the processing of large workpieces with spatially uniform results, a scanning system is desirable to uniformly scan the GCIB 128 across large areas to produce spatially homogeneous results. Two pairs of orthogonally oriented electrostatic scan plates 130 and 132 can be utilized to produce a raster or other scanning pattern across the desired processing area. When beam scanning is performed, the GCIB 128 is converted into a scanned GCIB 148, which scans the entire surface of workpiece 152.

Figure 2:
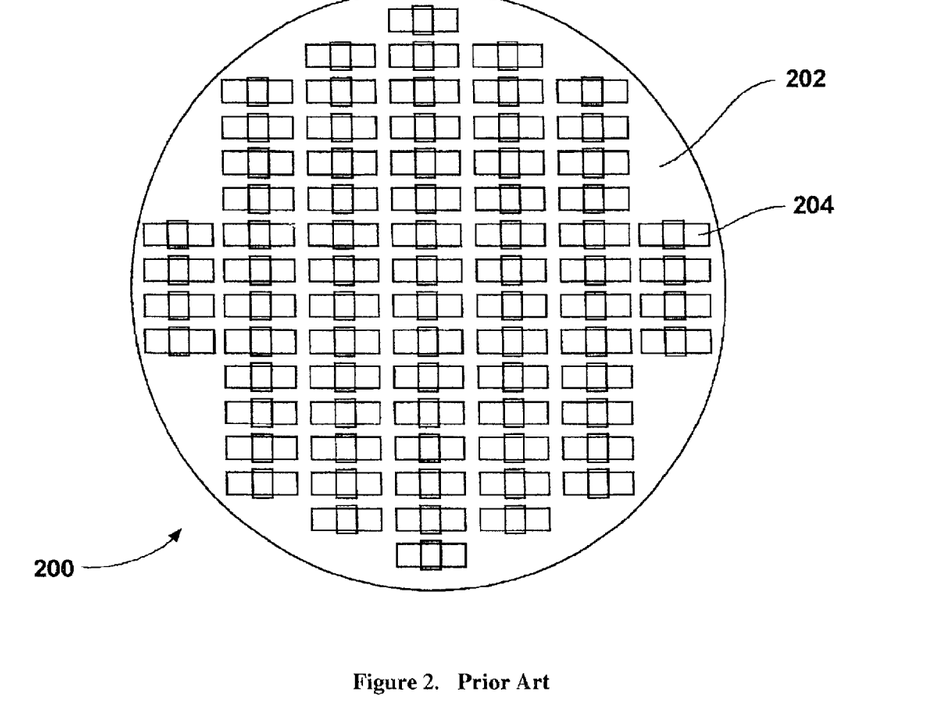
FIG. 2 shows a schematic of a prior art SAW substrate having multiple SAW devices.

FIG. 2 shows a schematic 200 of a typical SAW device substrate 202 having an array of SAW devices, of which, SAW device 204 is an example. The substrate 202 is a circular substrate, but the shape is not limited to circularity. The substrate 202 is typically of quartz, but it is recognized that other materials can also be used. The shape and size of the SAW device 204 is shown for example only and it is recognized that SAW devices may be constructed in a variety of shapes and sizes as is known in the SAW device arts. Practical SAW devices can be much smaller than the example SAW device 204 illustrated.

Figure 3:
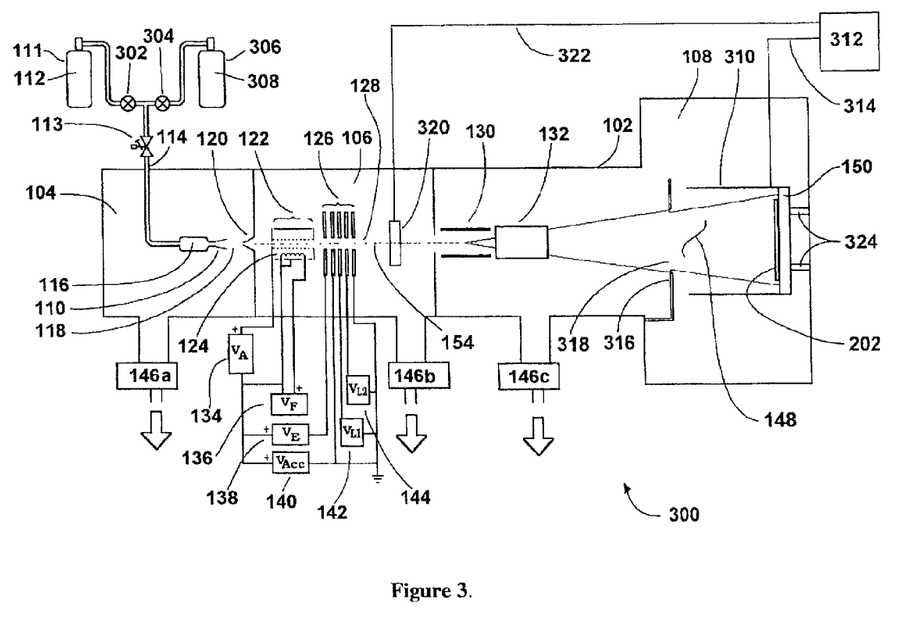
FIG. 3 shows a schematic of one embodiment of a GCIB processing system of the invention, for modifying the properties of the SAW device(s) on a substrate having one or more devices.

Reference is now made to FIG. 3 of the drawings, which schematically illustrates the GCIB processing system 300 of this invention. GCIB processing system 300 is utilized to trim or controllably adjust one or more of the properties of SAW device(s) on a substrate 202. More specifically, the GCIB processing system 300 provides a GCIB processor providing a GCIB 128 and a scanned GCIB 148. The scanned GCIB is utilized in the process chamber 108 to adjust one or more of the properties of SAW device(s) on substrate 202. A condensable source gas 112 is stored in a gas storage cylinder 111. A second, different, condensable source gas 308, is stored in second gas storage cylinder 306. Condensable source gas 112 may be, for example but not for limitation an inert gas such as argon and condensable source gas 308 may be, for example but not for limitation, a reactive gas such as $O_2$. First and second gas cutoff valves, 302 and 304 respectively, provide for selectably admitting one or the other of source gases 112 or 308 under pressure through gas metering valve 113 and gas feed tube 114 into stagnation chamber 116 through nozzle 110. Using conventional techniques, a scanned GCIB 148 is formed in the GCIB processing system. One or more electrically insulating supports 324 dispose a workpiece holder 150 in path of scanned GCIB 148. A substrate 202 for processing is held by workpiece holder 150 and disposes the substrate 202 in the path of scanned GCIB 148. A scanned beam-defining aperture plate 316 has a scanned beam-defining aperture 318 of predetermined and known area for defining the predetermined and known projected scanned area, A, of the region of incidence of scanned GCIB 148 in the plane of the surface of the substrate 202. A current collecting device 310 including workpiece holder 150 collects the portion of the current of the scanned GCIB 148 that falls on the workpiece holder 150 and substrate 202. The current collecting device is typically a Faraday cup, as shown, or some other form of current collecting electrode(s). The current collecting device 310 has a current conducting lead 314 for conducting collected current to a conventional dose processor 312. A beam gate 320 is disposed in the path of GCIB 128. Beam gate 320 has an open state and a closed state. When beam gate 320 is open, GCIB 128 passes through beam gate 320 and scanned GCIB 148 irradiates substrate 202. When beam gate 320 is closed, GCIB 128 is interrupted and does not pass through beam gate 320 and substrate 202 is not irradiated. A control cable 322 conducts control signals from a conventional dose processor 312 to beam gate 320, said control signals controllably switching beam gate 320 to either of its open or closed states for enabling or disabling GCIB processing of substrate 202. The dose processor 320 may be one of many conventional dose control circuits that are known in the art and may include as a part of its control systems all or part of a programmable computer system. In operation, the dose processor 312 signals the opening of the beam gate 320 to irradiate the substrate with the scanned GCIB 148. The dose processor 312 measures the beam current, $I_b$, collected by the current collecting device 310 and uses the predetermined projected scan area, A, to compute a dose rate, r, in ions/area/sec according to known techniques. The dose processor integrates the dose rate, r, with respect to time to compute the accumulated dose, d, received by the substrate 202. When the dose, d, received by the substrate 202 reaches a predetermined required dose, D, the dose processor closes the beam gate and processing is complete. The processing may be repeated with different substrates and with different desired doses.

Figure 4:
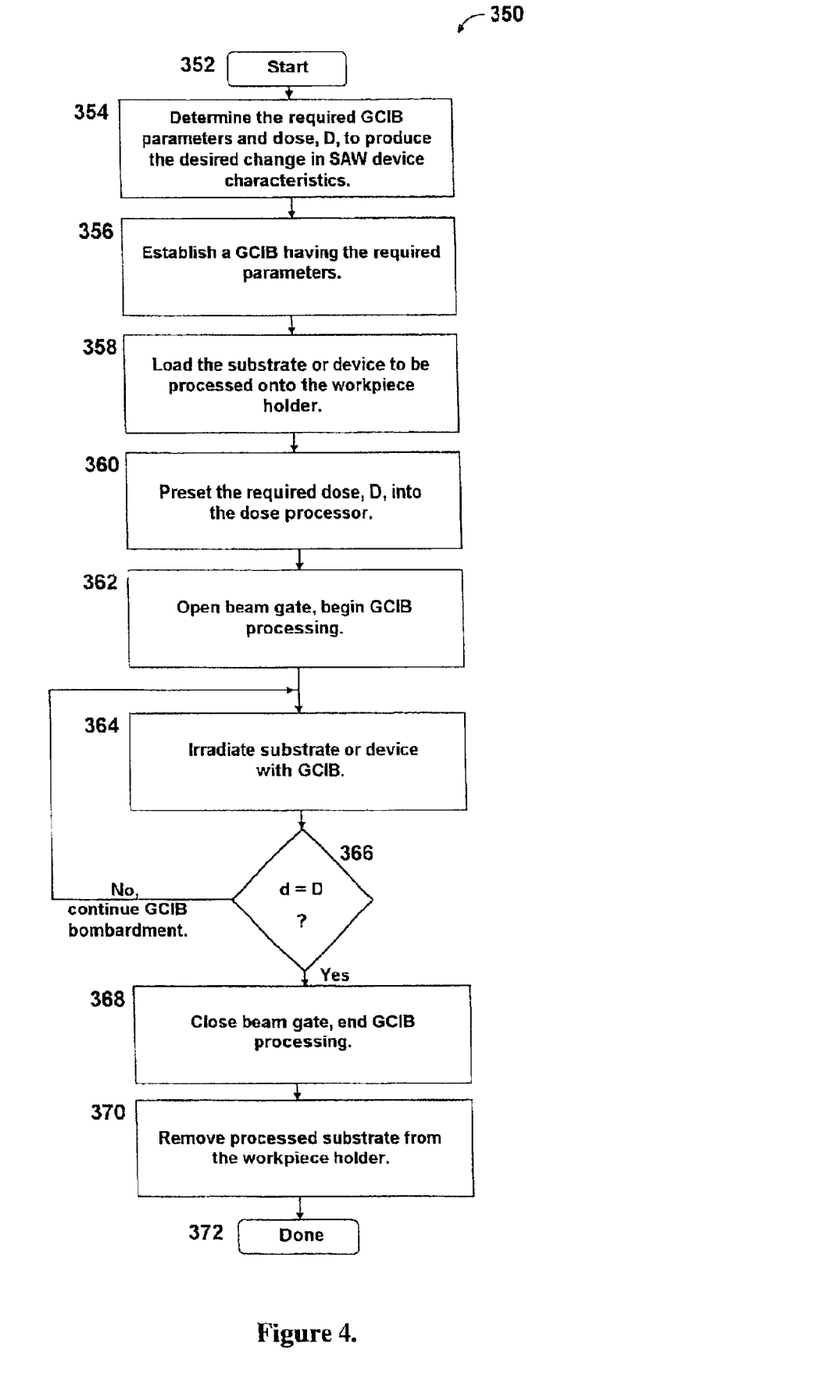
FIG. 4 is a flowchart of the steps for using the method of the invention with the GCIB SAW processing apparatus.

FIG. 4 shows a flowchart 350 of the steps in the method of the invention for adjusting the properties of all the (one or more) SAW device(s) on a substrate using the GCIB processing system shown in FIG. 3. The process starts at step 352. In step 354, the required GCIB parameters and dose, D, for producing a desired change in a SAW device characteristic is determined from characterization data for the particular SAW device design or manufacturing lot. For example, if the SAW device characteristic to be changed is center frequency, one first measures the mean center frequency of SAW devices on the substrate to be processed. The desired change in center frequency from the measured mean is determined according to the requirements of the SAW device being manufactured, then using the characterization data, for example the graph of FIG. 9A, the GCIB irradiation dose corresponding to the desired shift is selected and recorded as D. A method for characterizing the effect of a GCIB irradiation process is discussed with an example, hereinafter. In step 356, the required GCIB processing conditions are established in the GCIB processing system. This requires establishing a beam, setting proper energy, beam current, cluster size distribution, and other conditions forming part of the beam parameters used for the process. In step 358, the substrate containing the SAW device(s) to be modified are loaded onto the workpiece holder in the GCIB processing system. It is recognized that this may be done manually or with automated handling equipment with vacuum load locks according to known art. After loading, the GCIB processing system's dose processor is preset to the previously determined value, D, so that when GCIB processing begins the substrate will receive the dose, D. At step 362, the dose processor opens the beam gate, beginning the GCIB irradiation of the substrate. At steps 364 and 366, the substrate is irradiated with the GCIB until the total accumulated dose, d, as measured by the dose processor reaches the preset value, D, at which event, in step 368, the dose processor closes the beam gate, ending GCIB processing of the substrate. At step 370, the processed substrate with one or more SAW device(s) is removed from the workpiece holder. It is recognized that this can be done manually or with an automated mechanism as with the loading process. After the workpiece has been removed, the process is done, step 372.

Figure 5:
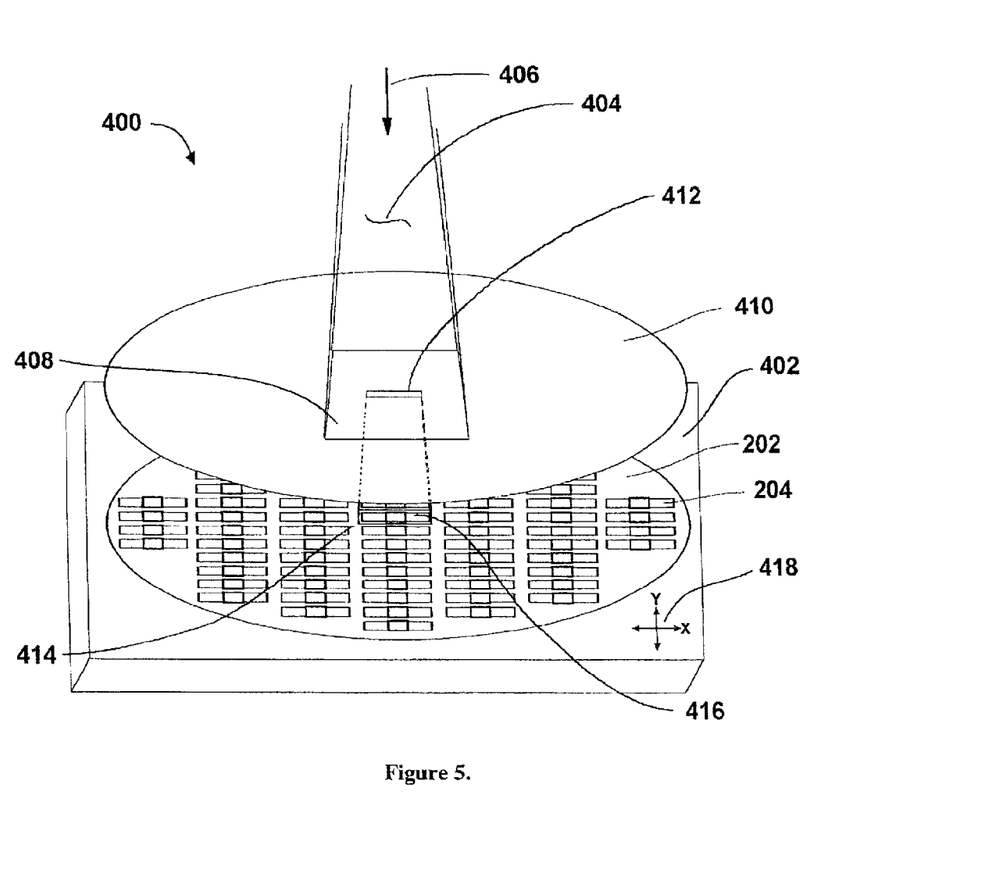
FIG. 5 shows a view of an aperture/positioning apparatus of an embodiment of the invention for processing individual regions on a substrate.

FIG. 5 shows an aperture and positioning apparatus 400 that is used with a second embodiment of the invention. In the GCIB processing system shown in FIG. 3, an entire substrate with one or more SAW device(s) may be processed, with all devices receiving the same GCIB irradiation dose. In the event that multiple SAW devices on a single substrate differ from one another sufficiently that groups of the devices or individual devices require individual adjustment to bring characteristics into agreement with specifications, the aperture and positioning apparatus 400 is useful. A scanned GCIB 404 has a mean direction 406 and is directed at an X-Y positioning table 402, which also serves as a workpiece holder. X-Y positioning table 402 is operable to move in orthogonal X-Y directions as shown by arrows indicating the X-Y axes of motion 418, and X-Y positioning table 402 holds a substrate 202. A beam-defining aperture plate 410 in the path of scanned GCIB 404 has a beam-defining aperture 412. The scanned GCIB 404 is incident on a scanned region 408 on the beam-defining aperture plate 410. The beam-defining aperture 412 in the beam-defining aperture plate 410 is inside of the scanned region 408 and has a known and predetermined size and shape so as to permit transmission of a portion of the scanned GCIB 404 to project onto the plane of the substrate 202. The portion of the scanned GCIB 404 that reaches the substrate 202 falls on a projected scanned area 414 on the substrate 202. The projected scanned area 414 has a known size and shape and having a known area, $A_1$, as predetermined by the beam-defining aperture 412 and the scanning system geometry of the GCIB apparatus that generates the scanned beam 404. By selection of the size and shape of the beam-defining aperture, the projected scanned area 414 can be made to cover a range of sized areas on the substrate, in this case shown, for example but not for limitation, to be an area that covers a single SAW device 416 and does not touch adjacent SAW devices. X-Y positioning table 418 moves by continuous motion or by stepwise motion according to known X-Y table positioning technology to position different regions of the substrate 202 within the projected scanned area 414. In the preferred arrangement, X-Y positioning table 418 is programmably operable to sequentially position each individual SAW device (or other selected region) of the substrate in the projected scanned area 414 for GCIB processing by the scanned beam 404. Although the invention has been shown with a beam defining aperture 412 of fixed size and shape, it is recognized that a changeable or adjustable aperture is also serviceable with appropriate adjustment of the dosimetry measurements dependent on the projected scanned area, $A_1$.

Figure 6:
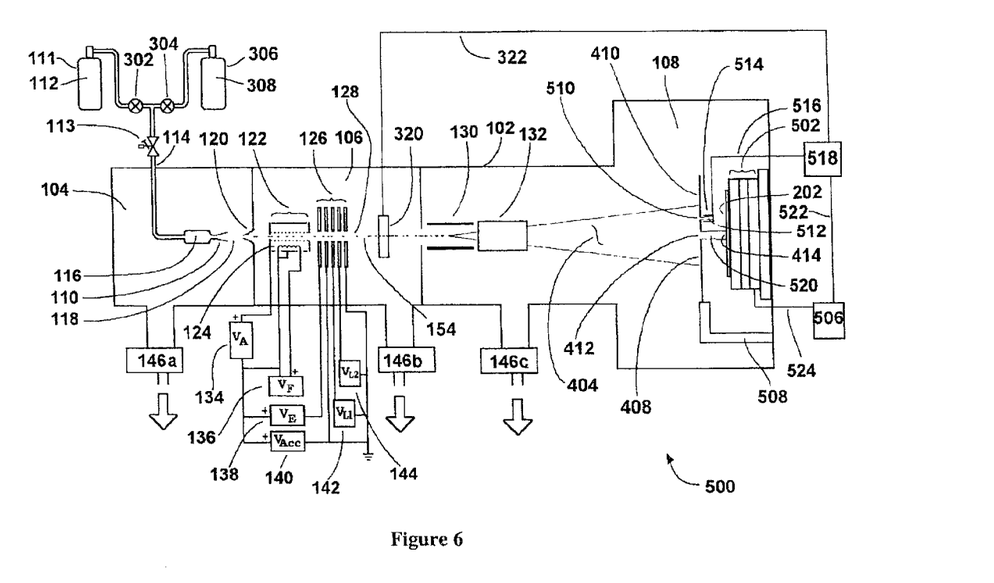
FIG. 6 shows a second embodiment of a GCIB processing system of the invention, for sequentially modifying individual regions of a SAW device substrate.

FIG. 6 shows a schematic 500 of a second embodiment of a GCIB processing system according to the present invention. The stepping GCIB processing system shown in schematic 500 is similar to the GCIB processing system shown in FIG. 3, but incorporates the improvement of the concept of the aperture and positioning apparatus shown in more detail in FIG. 5. The stepping GCIB processing system provides a scanned GCIB 404 directed at an X-Y positioning mechanism 502, which also serves as a workpiece holder. A beam-defining aperture plate 410, disposed in the path of scanned GCIB 404 by beam-defining aperture plate support 508, has a beam-defining aperture 412. The scanned GCIB 404 is incident on a scanned region 408 on the beam-defining aperture plate 410. The beam-defining aperture 412 in the beam-defining aperture plate 410 is inside of the scanned region 408 and permits transmission of a portion 520 of the scanned GCIB 404 to project onto the plane of the substrate 202. The portion 520 is incident on a projected scanned area 414 on the substrate 202. The projected scanned area 414 has a known area, $A_1$, as predetermined by the beam-defining aperture 412 and the scanning system geometry of the GCIB apparatus. The beam-defining aperture 412 has a predetermined aperture area of $A_2$. The beam-defining aperture plate 410 has a dosimetry aperture 510, having an aperture area, $kA_2$, that permits transmission of a dosimetry GCIB sample 512 into a GCIB current collection device 514, which may be a Faraday cup or the like. The GCIB current collection device 514 is electrically connected through a current conduction lead 516 to a conventional dose processor 518. A beam gate 320 is disposed in the path of GCIB 128. Beam gate 320 has an open state and a closed state. A control cable 322 conducts control signals from a conventional dose processor 518 to beam gate 320, said control signals controllably switching beam gate 320 to either of its open or closed states for enabling or disabling GCIB processing of substrate 202. X-Y positioning mechanism 502 is electrically connected by cable 524 to step controller 506. Under control of step controller 506, X-Y positioning mechanism 502 is operable to move in orthogonal X-Y directions and is programmably controllable to move by stepwise motion according to known X-Y table positioning technology to position different regions of the substrate 202 within the projected scanned area 414. In the preferred arrangement, X-Y positioning table 418 is programmably operable to sequentially position each individual SAW device (or other selected region) of the substrate in the projected scanned area 414 for GCIB processing by the scanned beam 404. It is recognized that the dose processor 518 may be one of many conventional dose control circuits that are known in the art and may include as a part of its control systems all or part of a programmable computer system. The step controller 506 may include as part of its control system all or part of a programmable computer system. Some or all of the step controller 506 and dose processor 518 logic may be performed by a small general purpose computer that also controls other portions of the GCIB processing system. In operation, the dose processor 518 signals the opening of the beam gate 320 to irradiate the exposed portion of the substrate with the scanned GCIB beam portion 520. The dose processor 518 measures the beam current, $I_b$, collected by the GCIB current collection device 514 and uses the predetermined projected scan area, $A_1$, and the ratios of the aperture areas $A_2$ and $kA_2$, to compute a dose rate, $r_1$, in ions/area/sec according to known techniques. The dose processor integrates the dose rate, $r_1$, with respect to time to compute the accumulated dose, d, received by the substrate 202 in the projected scanned area 414. When the dose, d, received by the projected scanned area 414 reaches a predetermined required dose, $D_i$, for the exposed region, the dose processor closes the beam gate and processing of the exposed region is complete. Completion of processing of the region of the substrate 202 is communicated by the dose processor 518 to the step controller 506 electrical signals on step signals cable 522. In response to the signals from the dose processor 518, the step controller 506 moves the X-Y positioning mechanism to position the next region to be processed under the beam defining aperture 412. The irradiation/step process is repeated until all regions of the substrate have been processed. Processing may be repeated with different substrates.

Figure 7:
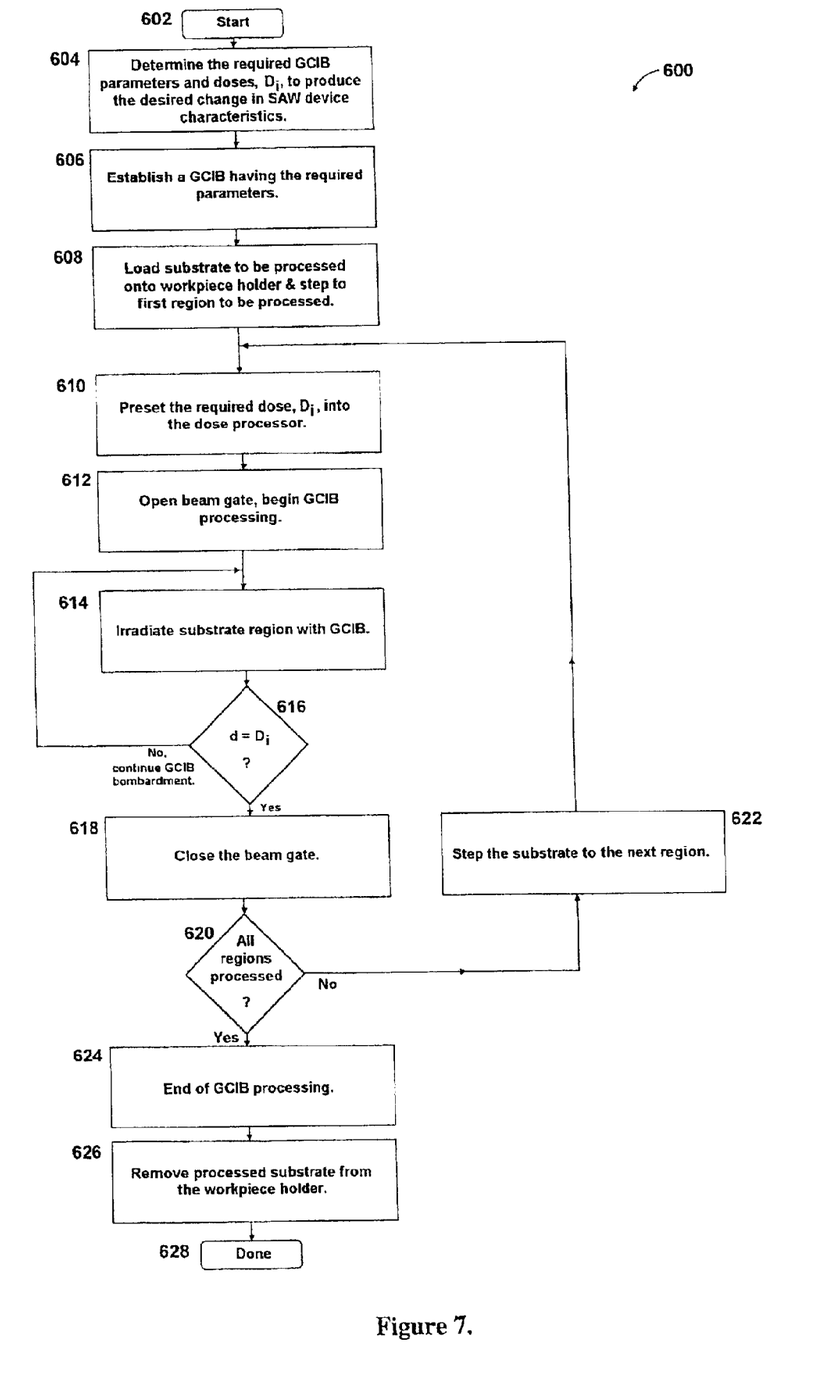
FIG. 7 is a flowchart of the steps for using the method of the invention for sequentially modifying individual regions of a SAW device substrate.

FIG. 7 shows a flowchart 600 of the steps in the method of the invention for individually adjusting the properties of SAW devices in multiple regions on a substrate using the GCIB processing system shown in FIG. 6. The process starts at step 602. In step 604, the required GCIB parameters are determined. Also the doses, $D_i$, for i=1 . . . n, (where n=the number of regions having one or more SAW devices for modifying) are determined from characterization data for the particular SAW device design or manufacturing lot as previously described. In step 606, the required GCIB processing conditions are established in the GCIB processing system. This requires establishing a beam, setting proper energy, beam current, cluster size distribution, and other conditions forming part of the beam parameters used for the process. In step 608, the substrate containing the SAW device(s) to be modified is loaded onto the workpiece holder in the GCIB processing system. It is recognized that this may be done manually or with automated handling equipment with vacuum load locks according to known art. After loading, at step 610, the GCIB processing system's dose processor is preset to the previously determined value, $D_i$, where initially i=1, for processing the first region of the substrate 202 so that when GCIB processing begins the first substrate region will receive the dose, $D_1$. At step 612, the dose processor opens the beam gate, beginning the GCIB irradiation of the substrate. At steps 614 and 616, the substrate region is irradiated with the GCIB until the total accumulated dose, d, as measured by the dose processor reaches the preset value, $D_i$, at which event, in step 618, the dose processor closes the beam gate, ending GCIB processing of the $i^{th}$ region of the substrate 202. Step 620 causes at step 622 the repositioning of the substrate to the next region and the subsequent repeating of steps 610–620 until all regions of the substrate have been individually modified. At step 624 the processing of all regions of the substrate 202 is complete. At step 626, the processed substrate with one or more SAW device(s) is removed from the workpiece holder. It is recognized that this can be done manually or with an automated mechanism as with the loading process. After the workpiece has been removed, the process is done, step 628.

Figure 8:
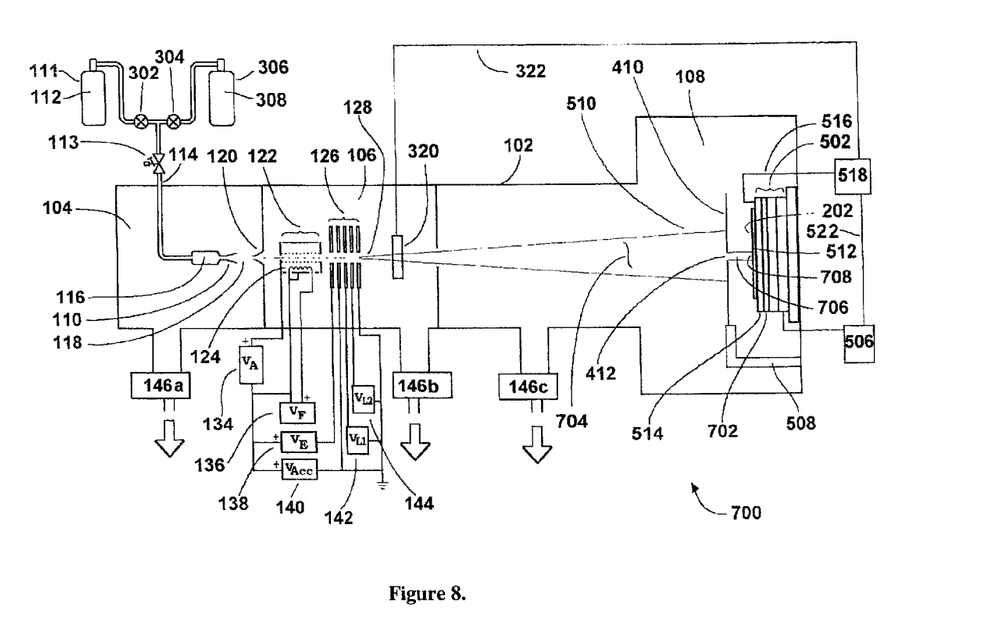
FIG. 8 shows a third embodiment of a GCIB processing system of the invention, for sequentially modifying individual regions of a SAW device substrate using an unscanned GCIB.

FIG. 8 shows a schematic 700 of a third embodiment of a GCIB processing system according to the present invention. The stepping GCIB processing system shown in schematic 700 is similar to the stepping GCIB processing system shown in FIG. 6, but has the improvement of not requiring beam scanning for operation. The GCIB processing system provides an unscanned GCIB 704 directed at an X-Y positioning mechanism 502, with substrate 202 to be processed. Rather than dispersing the beam over a scanned region on the beam-defining aperture plate 410, the unscanned beam is defocused by adjustment of lens power supplies 142 and 144 so as to provide an extended and diffuse beam rather than a sharply focused one to be incident on the beam-defining aperture plate 410. Alternatively, space charge effects that tend to enlarge the beam diameter may be used to provide the extended and diffuse beam. In either case, so long as the beam density is substantially uniform (less than a few percent variation in beam current density) over the area of the beam-defining aperture 412, this embodiment can be effectively employed. The beam-defining aperture 412 in the beam-defining aperture plate 410 is inside of the scanned region 408 and permits transmission of a portion 706 of the unscanned GCIB 704 to project onto the plane of the substrate 202. The portion 706 is incident on a projected area 708 on the substrate 202. The beam-defining aperture 412 has a predetermined aperture area of $A_3$. The projected area 708 has a known area, $A_4$, as predetermined by the beam-defining aperture 412 and the geometry of the GCIB apparatus. The GCIB current collection device 514 is in this case the conductive front surface of the X-Y positioning mechanism 502 and is electrically insulated from the other portions of the positioning mechanism by an electrically insulating region 702. The collected current is conducted to dose processor 518 by current conduction lead 516. In operation, the dose processor 518 measures the beam current, $I_b$, collected by the GCIB current collection device 514 and uses the predetermined projected area, $A_4$, to compute a dose rate, $r_2$, in ions/area/sec according to known techniques. The dose processor integrates the dose rate, $r_2$, with respect to time to compute the accumulated dose, d, received by the substrate 202 in the projected area 708. In other respects operation is similar to that of the system shown in FIG. 6.

With the GCIB processing apparatus shown in FIG. 3, a substrate with multiple SAW devices, or a substrate with a single SAW device (which could be a single die from a larger substrate) can be processed to adjust the properties of the SAW device(s). With the GCIB processing apparatus shown in FIG. 6 or the GCIB processing apparatus shown in FIG. 8, different regions of a substrate or individual SAW devices on a substrate can be sequentially processed with differing doses to provide individual predetermined adjustments for each region or for each SAW device on the substrate. The detailed nature of the processing and the method of characterizing the process is as follows.

An inert gas such as argon can be used to sputter etch away a portion of the surface material to change the properties of the SAW device. The surface of the IDTs and the surface of the substrate separating the IDTs are both etched by the GCIB. In any particular SAW device the relative etch rates of the two surfaces will differ depending on the materials of fabrication for the particular SAW device. In some SAW devices, the metal film IDTs are relatively thin and small decreases in their thickness causes a relatively large increase in the acoustic wave propagation velocity in the metal film. In other SAW devices, the metal film IDTs are relatively thick, and small changes in their thickness have relatively little effect on the acoustic wave propagation velocity in the metal film. In SAW devices having either thick or thin IDTs, the sputter etching or the substrate separating the IDTs changes the acoustic propagation velocity of the substrate. Depending on the materials of fabrication and the relative thickness of the IDTS, the net effect of inert GCIB irradiation of the SAW device characteristics can be to either increase or decrease the characteristic frequency (ies) of the device.

When reactive GCIB irradiation is performed, the result is to react the shallow surface layers with the gas clusters to modify the shallow surface layer's acoustic properties, most notably changing the elasticity, which affects the acoustic propagation velocity. For example, the acoustic velocity in aluminum oxide is higher than that in pure aluminum. Using an oxygen cluster beam to increase the thickness of the native oxide on IDTs of a SAW device having thin aluminum film IDTs by irradiating with oxygen cluster ions to consume aluminum by reaction to create the additional aluminum oxide, the acoustic velocity in the IDTs is increased and consequently so is the characteristic frequency of the device. $O_2$, $N_2$, $NH_3$, $CO_2$, or other reactive source gases may be used to achieve a variety of surface reaction effects.

Thus, because of the variety of different SAW device designs and materials of fabrication, and depending on whether it is desired to shift the properties so as to increase or decrease the characteristic frequency(ies) of the device, the use of either inert or reactive GCIBs can be chosen.

In addition to the choice of gas source materials (inert, or the reactive gases), other parameters (chiefly ion dose, ion energy, and cluster size distribution) can affect the rate of modification of the SAW device surface properties.

Generally ion energies of from 3 keV to 50 keV are preferable, with higher etch or reaction rates resulting for higher energies. Greater amounts of residual subsurface damage can also result from the use of higher energies. Accordingly, energies in the 5 keV to 30 keV are most preferable. Ion size distribution does not appear to be critical except that the smallest size clusters (fewer than 20 atoms or molecules per cluster) should be avoided since they can contribute to subsurface damage. Techniques for minimizing the quantities of smaller clusters include using stagnation pressures of several bar and using electrostatic or magnetic beam filters are known and conventional. The amount of change in SAW device properties is strongly related to the GCIB dose applied.

Figure 9A:
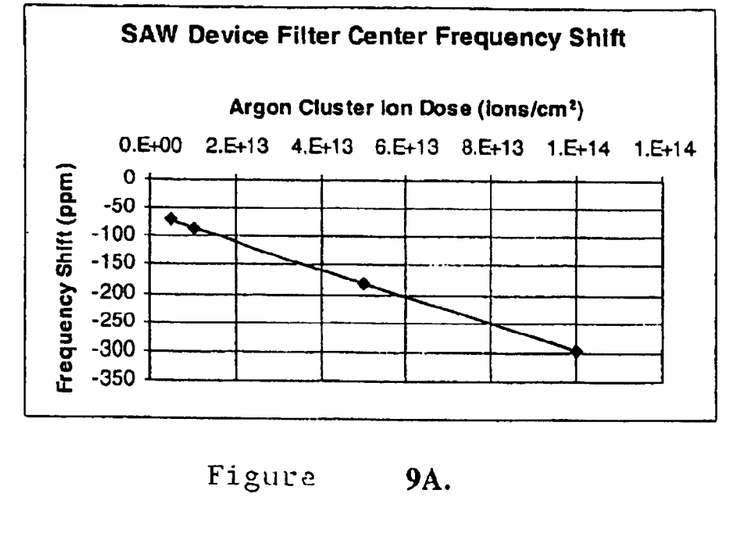
FIG. 9A is a graph showing the measured relationship between argon GCIB irradiation dose and a particular SAW device's center frequency shift.
Figure 9B:
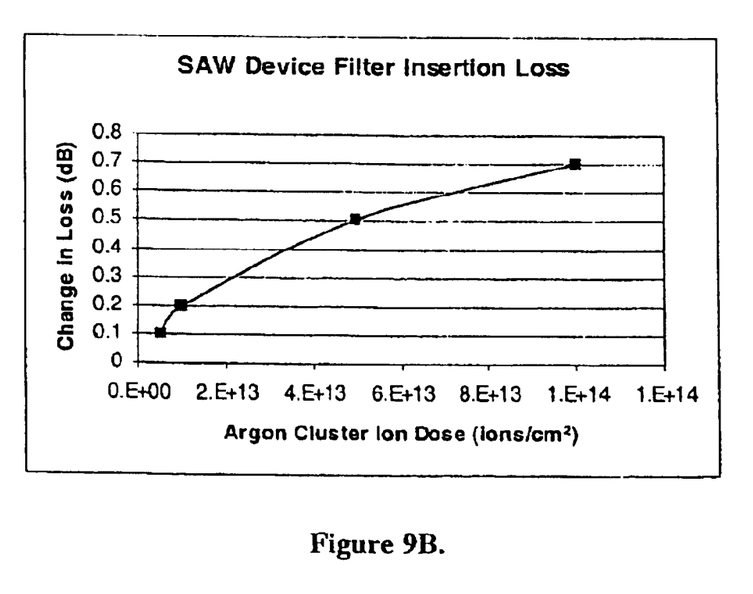
FIG. 9B is a graph showing the measured relationship between argon GCIB irradiation dose and a particular SAW device's change in insertion loss.

GCIB ion doses in the range of from $1\times10^{11}$ to $1\times10^{16}$ ions/cm$^2$ are useful for SAW device property adjustment. The required ion dose to provide a desired shift in properties is determined by a characterization measurement. As an example, consider the characterization measurement of the effect of a 20 keV argon GCIB on the center frequency of a SAW device of a specific design. The GCIB had a mean cluster size of ~2000 atoms. The SAW devices were resonator devices with measurable center frequencies and insertion losses. The nominal center frequency was approximately 730 MHz and the devices were constructed on rotated-Y cut quartz substrates and had Cu/Al IDTs. Samples of the devices were subjected to a matrix of different ion doses while holding other beam parameters fixed. Initial center frequencies and insertion losses were recorded and shifts in those properties were recorded after processing. FIG. 9A shows the resulting shift in center frequency as a function of ion dose. FIG. 9B shows the (small) change in insertion loss that resulted from the GCIB processing.

Although the invention has been described with respect to various embodiments, it should be realized this invention is also capable of a wide variety of further and other embodiments within the spirit and scope of the appended claims, for example this invention may also be used to adjust the properties of other types of devices, outside of SAW devices, such as MEMS devices, which require the precise removal or addition of small amounts of material without significantly damaging or degrading the performance of the device.

What is claimed is:

1. A method of adjusting a property of a SAW device using a gas cluster ion beam comprising:

a. providing a substrate containing at least one SAW device;

b. opening a beam gate to allow the gas cluster ion beam to pass there through in the direction of the at least one SAW device;

c. exposing an area on the at least one SAW device to a dose of ions from the gas cluster ion beam; and d. closing said beam gate when the dose is delivered.

2. The method of claim 1 wherein the area comprises an entire SAW device.

3. The method of claim 1 wherein the area encompasses a plurality of SAW devices.

4. The method of claim 1 further comprising repeating steps b through d.

5. The method of claim 4 wherein the dose varies during each exposing step.

6. The method of claim 4 wherein the area varies during each exposing step.

7. The method of claim 4 further comprising moving the substrate before repeating steps b through d.

8. The method of claim 7 wherein the moving step is programmably operated.

9. The method of claim 7 wherein the moving step is accomplished in a step-wise motion.

10. The method of claim 4, wherein the dose delivered during successive exposing steps is variable from step to step.

11. The method of claim 4, further comprising the step of adjusting the exposure areas between successive exposing steps.

12. The method of claim 1 wherein the exposing step comprises utilizing a portion of the gas cluster ion beam.

13. The method of claim 12 wherein the area comprises an entire SAW device.

14. The method of claim 12 wherein the area encompasses a plurality of a SAW devices.

15. The method of claim 12 further comprising repeating steps b through d.

16. The method of claim 15 wherein the dose varies during each exposing step.

17. The method of claim 15 wherein the area varies during each exposing step.

18. The method of claim 15 further comprising moving the substrate before repeating steps b through d.

19. The method of claim 18 wherein the moving step is programmably operated.

20. The method of claim 18 wherein the moving step is accomplished in a step-wise motion.

21. The method of claim 18 wherein the gas cluster ion beam is not scanned.

22. The method of claim 15, wherein the dose delivered during successive exposing steps is variable from step to step.

23. The method of claim 15, further comprising the step of adjusting the exposure areas between successive exposing steps.

24. The method of claim 1 wherein the property is the characteristic frequency of the SAW device.

25. The method of claim 1 wherein the property is adjusted by removing material from the at least one SAW device.

26. The method of claim 1 wherein the property is adjusted by adding material to the at least one SAW device.

27. A gas cluster ion beam processing system comprising:
a source for producing a gas cluster ion beam;
a beam gate disposed in the path of said gas cluster ion beam, said beam gate having an open state and a closed state, wherein said open state allows said gas cluster ion beam to pass through said beam gate and irradiate a substrate and said closed state prohibits said gas cluster ion beam to pass through said beam gate;
a gate controller that operably controls said open state and said closed state in said beam gate; and
a beam defining means having an aperture disposed in the path of said gas cluster ion beam which defines an area on said substrate that is to be exposed to said gas cluster ion beam.

28. The processing system of claim 27 further comprising a means for moving said substrate.

29. The processing system of claim 28 wherein said moving means is programmably operated.

30. The processing system of claim 28 wherein a portion of said moving means is utilized as a current collection device.

31. The processing system of claim 28 wherein said moving means comprises a stage and a step controller.

32. The processing system of claim 27 wherein said beam defining aperture is adjustable.

33. The processing system of claim 27 further comprising means for selectably admitting a plurality of gases to said source.

34. The processing system of claim 27 wherein the beam defining means further comprising a dosimetry aperture located adjacent to said aperture that permits transmission of a dosimetry sample into a current collection device.

35. The processing system of claim 27 wherein said gate controller is programmably operated.

36. The processing system of claim 35 wherein said programmable operation is based upon a dose of ions being delivered.

37. The processing system of claim 36 wherein the dose delivered is adjustable.

38. The processing system of claim 27 wherein said substrate contains at least one SAW device.

* * * * *